(12) United States Patent
Heintzelman et al.

(10) Patent No.: US 10,825,958 B2
(45) Date of Patent: Nov. 3, 2020

(54) ELECTRO-OPTIC DEVICE WITH MOUNTED PRINTED CIRCUIT BOARD

(71) Applicant: Gentex Corporation, Zeeland, MI (US)

(72) Inventors: Adam R. Heintzelman, Grand Rapids, MI (US); Xiaoxu Niu, Holland, MI (US); Carl N. Wassink, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 16/562,505

(22) Filed: Sep. 6, 2019

(65) Prior Publication Data

US 2020/0083404 A1    Mar. 12, 2020

Related U.S. Application Data

(60) Provisional application No. 62/728,249, filed on Sep. 7, 2018.

(51) Int. Cl.
| | |
|---|---|
| *H01L 33/42* | (2010.01) |
| *H01L 27/32* | (2006.01) |
| *H01L 23/495* | (2006.01) |

(52) U.S. Cl.
CPC ........ *H01L 33/42* (2013.01); *H01L 23/49531* (2013.01); *H01L 27/3232* (2013.01)

(58) Field of Classification Search
CPC ............... H01L 33/42; H01L 23/49531; H01L 27/3232
See application file for complete search history.

(56) References Cited

U.S. PATENT DOCUMENTS

| | | | | |
|---|---|---|---|---|
| 2006/0181772 A1* | 8/2006 | Byers | ................... | G02B 7/1815 359/512 |
| 2006/0291034 A1* | 12/2006 | Patry | ..................... | G02F 1/1339 359/296 |
| 2007/0211002 A1* | 9/2007 | Zehner | .................. | G02F 1/1679 345/84 |
| 2010/0097469 A1* | 4/2010 | Blank | ................ | H04N 5/23293 348/148 |

(Continued)

FOREIGN PATENT DOCUMENTS

WO    2015048161 A1    4/2015

*Primary Examiner* — Seahvosh Nikmanesh
(74) *Attorney, Agent, or Firm* — Price Heneveld LLP; Bradley D. Johnson

(57) ABSTRACT

An electro-optic device is provided having a first transparent substrate having a first surface and a second surface opposite the first surface; a first transparent electrode on the second surface of the first substrate; a second transparent substrate having a first surface and a second surface opposite the first surface; a second transparent electrode on the first surface of the second substrate, wherein the second substrate is positioned in spaced relation to the first substrate, wherein an extended portion of the first substrate extends beyond an edge of the second substrate; an electro-optic medium disposed between the first substrate and the second substrate, wherein the electro-optic medium is electrically coupled to the first electrode and the second electrode; and a printed circuit board mounted directly to the extended portion of the first substrate, the printed circuit board having a first electrical contact electrically coupled to the first electrode.

20 Claims, 6 Drawing Sheets

(56) References Cited

U.S. PATENT DOCUMENTS

| | | | |
|---|---|---|---|
| 2011/0188122 A1* | 8/2011 | Habibi | G02B 17/00 359/604 |
| 2016/0075284 A1 | 3/2016 | Green et al. | |
| 2016/0082890 A1 | 3/2016 | Habibi et al. | |

* cited by examiner

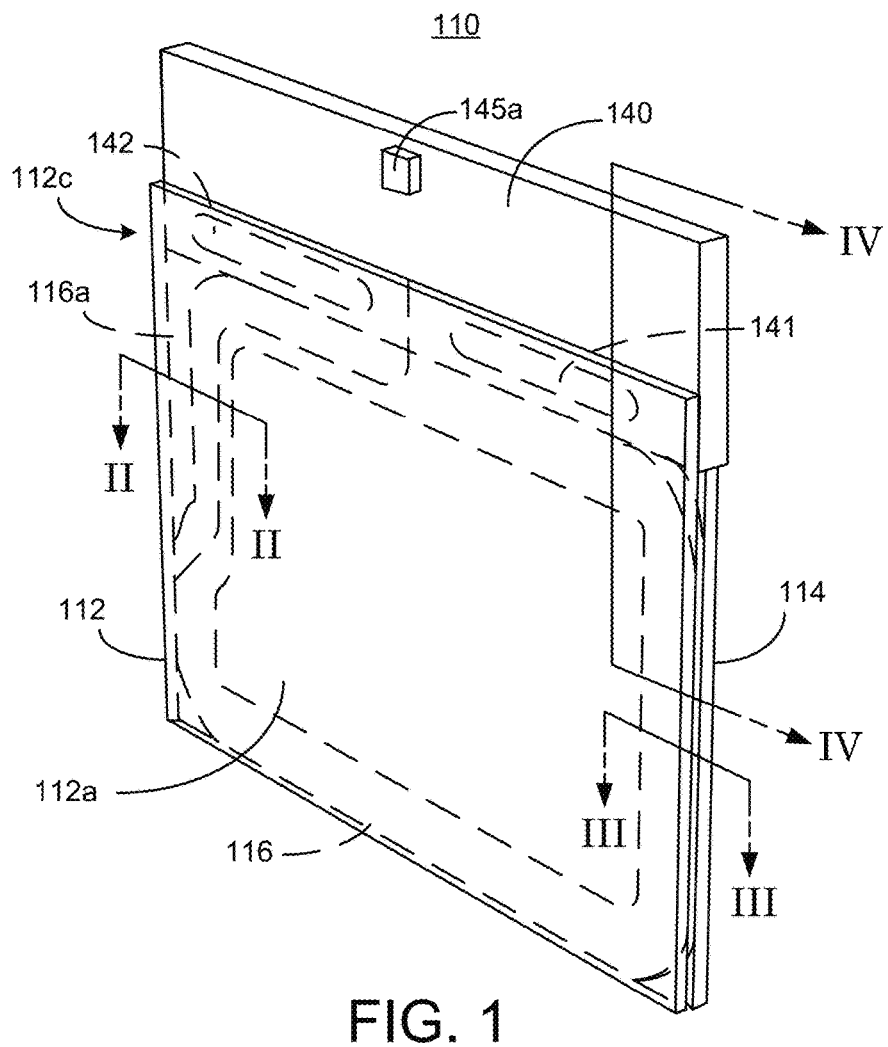
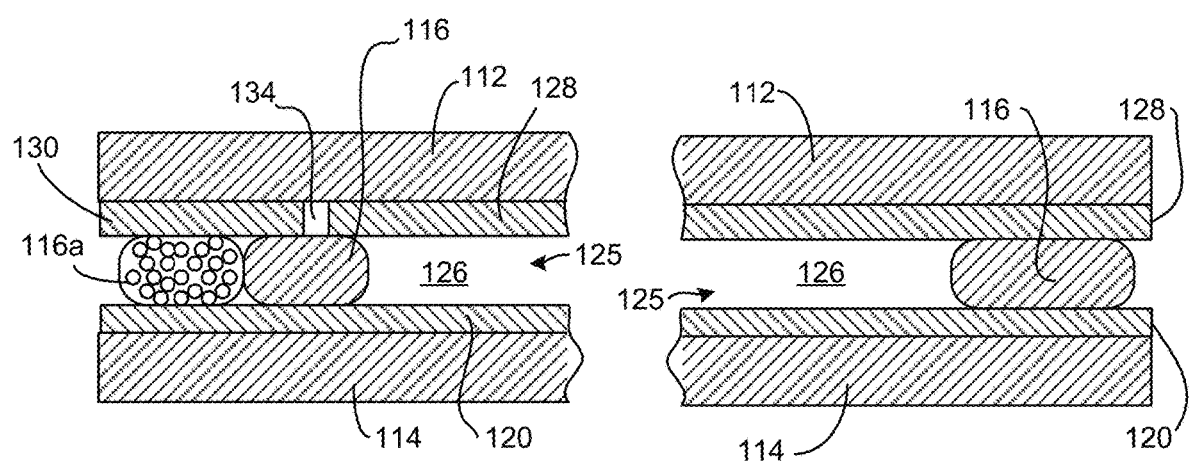
FIG. 1
FIG. 2
FIG. 3

ELECTRO-OPTIC DEVICE WITH MOUNTED PRINTED CIRCUIT BOARD

CROSS-REFERENCE TO RELATED APPLICATION

This application claims priority to and the benefit under 35 U.S.C. § 119(e) of U.S. Provisional Patent Application No. 62/728,249, filed on Sep. 7, 2018, entitled "ELECTRO-OPTIC DEVICE WITH MOUNTED PRINTED CIRCUIT BOARD," by Adam R. Heintzelman et al., the entire disclosure of which is incorporated herein by reference.

FIELD OF THE INVENTION

The present invention generally relates to an electro-optic device, and more particularly, to an electrochromic device of a type that may be used as a lens cover in an imager module for a vehicle.

SUMMARY OF THE INVENTION

According to one aspect of the present invention, an electro-optic device is provided comprising: a first transparent substrate having a first surface and a second surface opposite the first surface; a first transparent electrode provided on the second surface of the first transparent substrate; a second transparent substrate having a first surface and a second surface opposite the first surface; a second transparent electrode provided on the first surface of the second transparent substrate, wherein the second transparent substrate is positioned in spaced relation to the first transparent substrate, wherein an extended portion of the first transparent substrate extends beyond an edge of the second transparent substrate; an electro-optic medium disposed between the first transparent substrate and the second transparent substrate, wherein the electro-optic medium is electrically coupled to the first transparent electrode and the second transparent electrode; and a printed circuit board mounted directly to the extended portion of the first transparent substrate, the printed circuit board having a first electrical contact electrically coupled to the first transparent electrode.

According to one aspect of the present invention, an electro-optic device is provided comprising: a first transparent substrate having a first surface and a second surface opposite the first surface; a first transparent electrode provided on the second surface of the first transparent substrate; a second transparent substrate having a first surface and a second surface opposite the first surface; a second transparent electrode provided on the first surface of the second transparent substrate, wherein the second transparent substrate is positioned in spaced relation to the first transparent substrate, wherein an extended portion of the first transparent substrate extends beyond an edge of the second transparent substrate; an electro-optic medium disposed between the first transparent substrate and the second transparent substrate, wherein the electro-optic medium is electrically coupled to the first transparent electrode and the second transparent electrode; a third transparent electrode provided on the second surface of the first transparent substrate and electrically isolated from the first transparent electrode, wherein the third transparent electrode is electrically coupled to the second transparent electrode; and a printed circuit board mounted directly to the extended portion of the first transparent substrate. The printed circuit board comprises: a first electrical contact electrically coupled to the first transparent electrode and a second electrical contact coupled to the third transparent electrode.

According to one aspect of the present invention, an imager module for a vehicle is provided comprising: a housing having an opening; an imager disposed in the housing to capture images through the opening; and an electro-optic device disposed within the opening so as to selectively conceal the imager. The electro-optic device comprises: a first transparent substrate having a first surface and a second surface opposite the first surface; a first transparent electrode provided on the second surface of the first transparent substrate; a second transparent substrate having a first surface and a second surface opposite the first surface; a second transparent electrode provided on the first surface of the second transparent substrate, wherein the second transparent substrate is positioned in spaced relation to the first transparent substrate, wherein an extended portion of the first transparent substrate extends beyond an edge of the second transparent substrate; an electro-optic medium disposed between the first transparent substrate and the second transparent substrate, wherein the electro-optic medium is electrically coupled to the first transparent electrode and the second transparent electrode; and a printed circuit board mounted directly to the extended portion of the first transparent substrate, the printed circuit board having a first electrical contact electrically coupled to the first transparent electrode.

These and other features, advantages, and objects of the present invention will be further understood and appreciated by those skilled in the art by reference to the following specification, claims, and appended drawings.

BRIEF DESCRIPTION OF THE DRAWINGS

The present invention will become more fully understood from the detailed description and the accompanying drawings, wherein:

FIG. 1 is a perspective view of an electro-optic assembly according to the embodiment described below;

FIG. 2 is a cross-sectional view of the electro-optic assembly of FIG. 1 taken along line II-II;

FIG. 3 is a cross-sectional view of the electro-optic assembly of FIG. 1 taken along line III-III;

DETAILED DESCRIPTION OF THE EMBODIMENT

Figure 4:
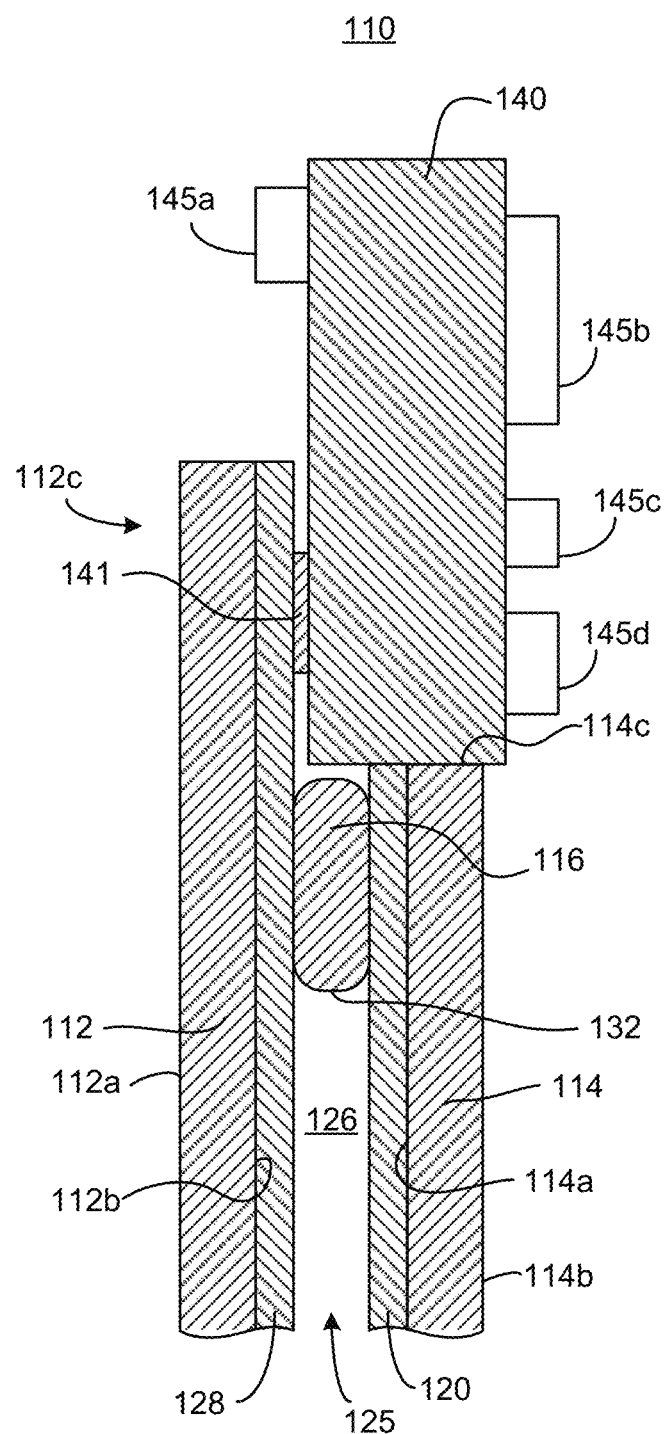
FIG. 4 is a cross-sectional view of the electro-optic assembly of FIG. 1 taken along line IV-IV.
Figure 5:
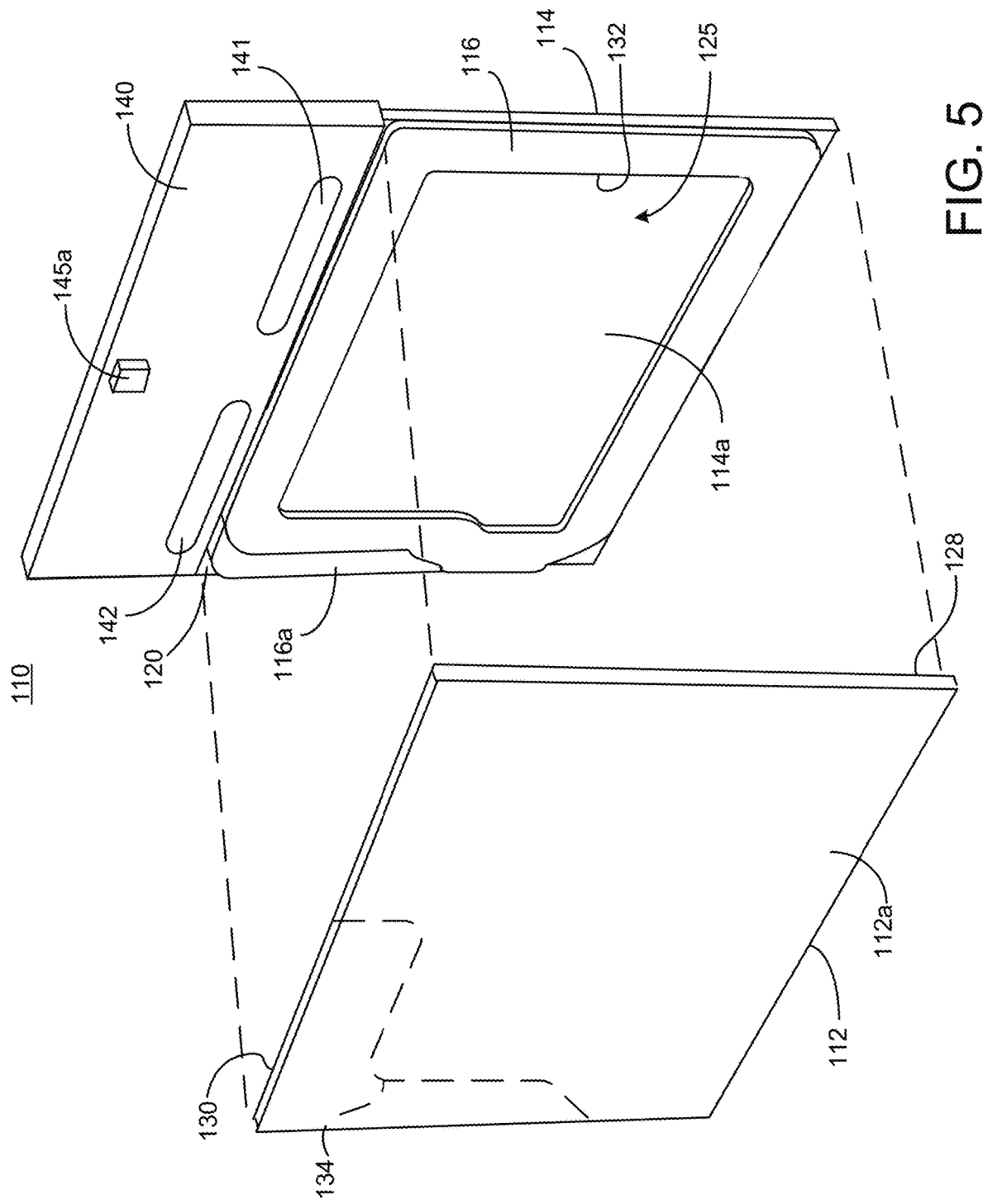
FIG. 5 is an exploded perspective view of the electro-optic assembly of FIG. 1.

For purposes of description herein, the terms "upper," "lower," "right," "left," "rear," "front," "vertical," "horizontal," and derivatives thereof shall relate to the electro-optic device as oriented in FIG. 1. However, it is to be understood that the device may assume various alternative orientations and step sequences, except where expressly specified to the contrary. It is also to be understood that the specific devices and processes illustrated in the attached drawings and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Referring to the embodiment illustrated in FIG. 1, reference numeral 110 generally designates an electro-optic device 110, which may be an electrochromic device. Electro-optic device 110 may be adapted to be installed in an imager module 10 (FIGS. 6-10) on a motor vehicle 12 as described further below.

As with any vehicle component, there is a desire to reduce the costs of materials and manufacturing in such electro-optic devices. In prior electro-optic devices, a printed circuit board including the drive circuitry and a light sensor for controlling the electro-optic device is mounted behind the electro-optic device and wires or other connectors are required to electrically connect the circuit board to electrodes of the electro-optic device 110. Such wires or connectors add to the cost and complexity of manufacturing the electro-optic device. Further, it may be desirable to make the electro-optic device more compact. However, it is difficult to make the electro-optic device more compact from front to rear when the circuit board is located behind the electro-optic device as in prior configurations.

As shown in FIGS. 2-5 the electro-optic device 110 may have a first transparent substrate 112 having a front first surface 112a and a rear second surface 112b, and a second transparent substrate 114 having a front first surface 11 and a rear second surface 114b. A chamber 125 is provided between a first transparent electrode 128 (carried on the second surface 112b of first transparent substrate 112), a second transparent electrode 120 (disposed on the first surface 114a of second transparent substrate 114), and an inner circumferential wall 132 of a sealing member 116. An electro-optic medium 126 such as an electrochromic medium may be contained within chamber 125.

As broadly used and described herein, the reference to an electrode or layer as being "carried" or "provided" on a surface of an element refers to both electrodes or layers that are disposed directly on the surface of an element or disposed on another coating, layer or layers that are disposed directly on the surface of the element.

The first transparent substrate 112 may include an extended portion 112c that extends beyond an outer peripheral edge 114c of the second transparent substrate 114. The electro-optic device 110 may also include a printed circuit board 140 mounted directly to the extended portion 112c of the first transparent substrate 112. The printed circuit board 140 may have a first electrical contact 141 electrically coupled to the first transparent electrode 128. Printed circuit board 140 may also include a second electrical contact 142 coupled to a third transparent electrode 130, which is provided on the second surface 112b of the first transparent substrate 112. The third transparent electrode 130 is electrically isolated from the first transparent electrode 128 by an isolation line 134 etched in the layer of transparent electrically conductive material that forms the first and third transparent electrodes 128 and 130. As best shown in FIG. 2, the third transparent electrode 130 is electrically coupled to the second transparent electrode 120 by an electrically conductive portion 116a of the seal member 116.

By forming the electro-optic device 110 to have the extended portion 112c and by mounting the printed circuit board 140 to the second surface 112b, the need for costly and complex wires or connectors is eliminated. Further, the electro-optic device 110 can be made more compact.

The first and second electrical contacts 141 and 142 of the printed circuit board 140 may be attached to the first and third transparent electrodes 128 and 130, respectively, using an electrically conductive epoxy such as Ag- or C-based conductive epoxy. The first and second electrical contacts 141 and 142 may be conductive pads printed on the printed circuit board 140.

The printed circuit board 140 may be rigid or may be a flexible printed circuit board. Flexible printed circuit boards provide for smaller overall packaging size. As shown in FIG. 4, the printed circuit board 140 may include various electronic components 145a-145d that may include a forward-facing light sensor 145a and drive circuitry 145b, 145c, and 145d for controlling the coloring/transmission state of the electro-optic device 110. Such control may be performed as a function of the light level sensed by the light sensor 145a as described herein.

Although an electrically conductive portion 116a of the seal 116 is used to electrically couple the third transparent electrode 130 to the second transparent electrode 120, and hence the second electrical contact 142 of the printed circuit board 140 is connected to the second transparent electrode 120, there are numerous other ways to provide such an electrical connection. Examples of such other forms of electrical connection are disclosed in commonly-assigned U.S. Pat. No. 7,064,882, the entire disclosure of which is incorporated herein by reference.

Transparent electrodes 120, 128, and 130 may be made of any material which bonds well to substrates 112 and 114, is resistant to corrosion to any materials within the electro-optic device 110, is resistant to corrosion by the atmosphere or road salts, has minimal diffuse or specular reflectance, high light transmission, near neutral coloration, and good electrical conductance. Transparent electrodes 120, 128, and 130 may be made of fluorine-doped tin oxide; doped zinc oxide; indium zinc oxide ($Zn_3In_2O_6$); indium tin oxide (ITO); ITO/metal/ITO (IMI) as disclosed in "Transparent Conductive Multilayer-Systems for FPD Applications," by J. Stollenwerk, B. Ocker, K. H. Kretschmer of LEYBOLD AG, Alzenau, Germany; the materials described in above-referenced U.S. Pat. No. 5,202,787, such as TEC 20 or TEC 15, available from Libbey-Owens-Ford Co. of Toledo, Ohio; other transparent conductive metal oxides; or other transparent conductors. Generally, the conductance of the material forming transparent electrodes 120, 128, 130 will depend on its thickness and composition. IMI generally has superior conductivity compared with the other materials. IMI, however, is known to undergo more rapid environmental degradation and suffer from interlayer delamination. The thicknesses of the various layers in the IMI structure may vary, but generally the thickness of the first ITO layer ranges from about 10 Å to about 200 Å, the metal ranges from about 10 Å to about 200 Å, and the second layer of ITO ranges from about 10 Å to about 200 Å. If desired, an optional layer or layers of a color suppression material (not shown) may be deposited between the transparent first electrode 128 and the second surface 112b of substrate 112 to suppress the reflection of any unwanted portions of the electromagnetic spectrum.

Although the electro-optic device 110 is shown in FIG. 1 and described above where the first substrate 112 is the front substrate, the first transparent substrate 112 may alternatively be the rear substrate such that the printed circuit board 140 is mounted to the front surface of the rear substrate.

The first and second substrates 112 and 114 may be made of glass or a transparent plastic.

The electro-optic material 126 may be any appropriate electrochromic material, such as single-layer, single-phase electrochromic materials, multi-layer electrochromic materials, or multi-phase electrochromic materials. Illustrative electrochromic materials include those described in U.S. Pat. Nos. 4,902,108, 5,888,431, 5,940,201, 6,057,956, 6,268,950, 6,519,072, 6,635,194, 8,928,966, and 9,939,701, and U.S. Patent Publication No. 2016/0377946, which are incorporated herein by reference in their entirety. Anodic and cathodic electrochromic materials may also include coupled materials as described in U.S. Pat. No. 6,249,369. The concentration of the electrochromic materials may be selected as taught in U.S. Pat. No. 6,137,620. The electrochromic material may exhibit a change in its extinction coefficient at one or more wavelengths upon exposure to a particular voltage. This behavior may be observed as a change in coloration or transmittance of the electrochromic material. In some embodiments the electrochromic material may produce a change in the appearance of the electrochromic device in response to an applied voltage.

As noted above and described below with respect to FIGS. 6-10, the electro-optic device 110 may be used as a lens cover 14 in an imager module 10 of a vehicle 12 or may be placed behind the lens cover 14 disposed proximate an imager lens 16. The cover 14 is configured to allow an imager 20 to capture image data 22 through the cover 14. The cover 14 is operable between a first condition (FIG. 7), wherein the imager 20 is generally visible through the cover 14, and a second condition (FIG. 8), wherein the imager 20 is generally concealed from view by the cover 14.

The use of imagers (including cameras, sensors, etc.) on vehicles is becoming more widespread in an effort to increase safety and provide additional functionality on vehicles. Oftentimes these imagers are not aesthetically pleasing to the consumer. Accordingly, ways to conceal the imagers, yet enable a full range of use for the imagers, are valuable. Vehicle manufacturers are utilizing more imagers than ever before in an effort to move the industry toward semiautonomous and fully autonomous vehicles. However, the appearance of the imagers, as noted above, can be unsightly. The concepts set forth herein address concealability issues.

In an effort to conceal imagers from view, mechanical systems are frequently used. However, mechanical systems frequently require moving parts, which, over time, results in wear and tear on static and moving parts of the system, resulting in failure of the mechanical system. An alternative is to utilize electro-optic device 110 in the cover 14 that extends over the imager lens 16.

Figure 6:
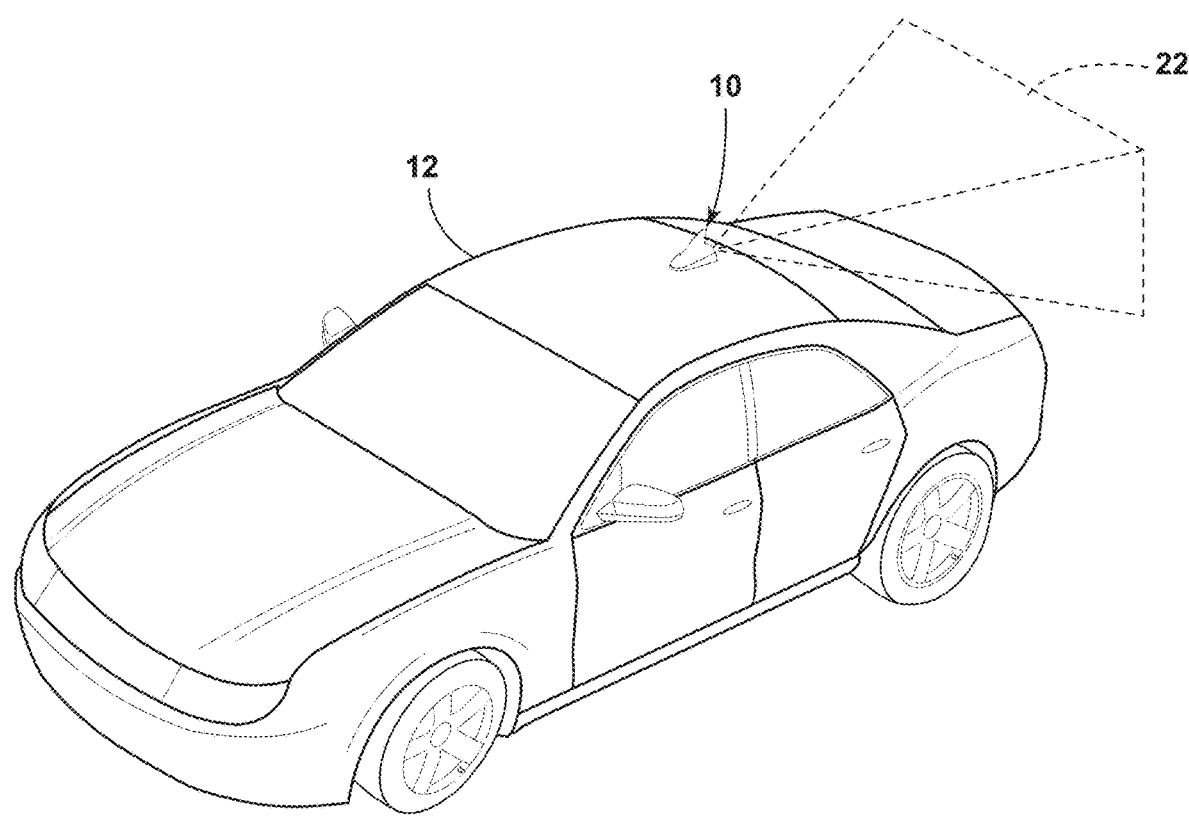
FIG. 6 is a top perspective view of one embodiment of a roof-mounted antenna and imager module installed on a roof of a vehicle that incorporates the electro-optic device of FIG. 1.
Figure 6A:
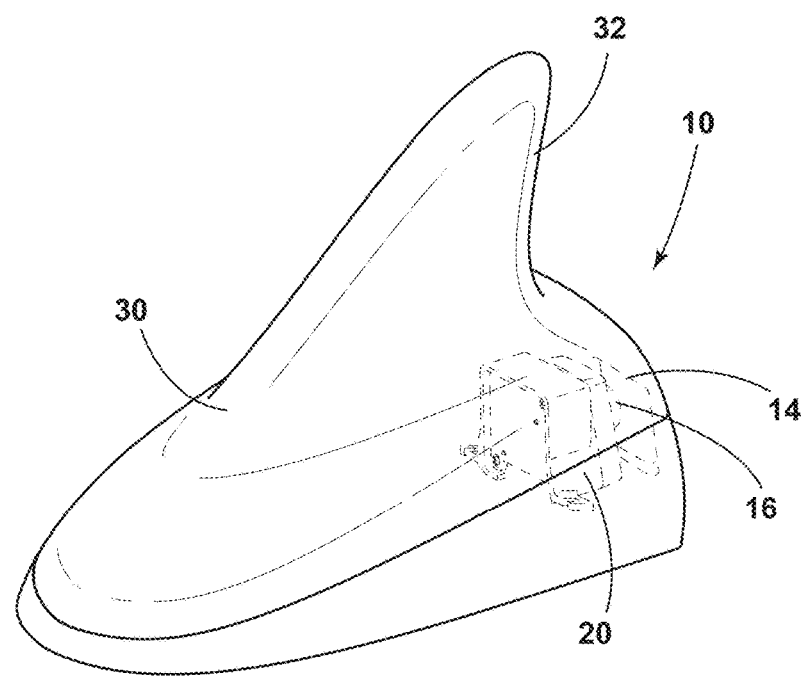
FIG. 6A is a front top perspective view of the roof-mounted antenna and imager module of FIG. 6.
Figure 7:
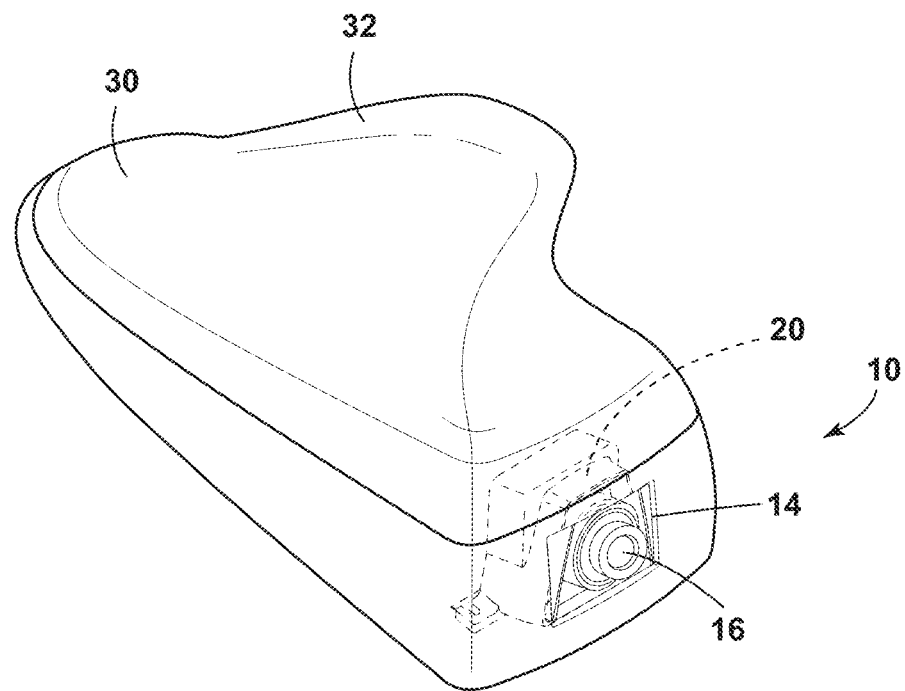
FIG. 7 is a rear top perspective view of the roof-mounted antenna and imager module of FIG. 6.
Figure 8:
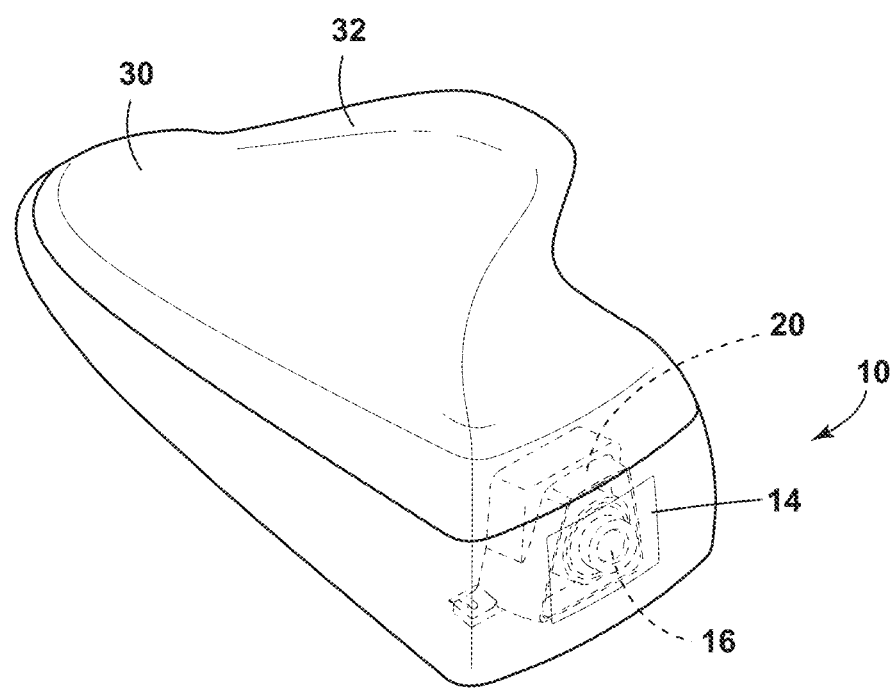
FIG. 8 is a rear top perspective view of the roof-mounted antenna and imager module of FIG. 6 with the imager module hidden from view.
Figure 9:
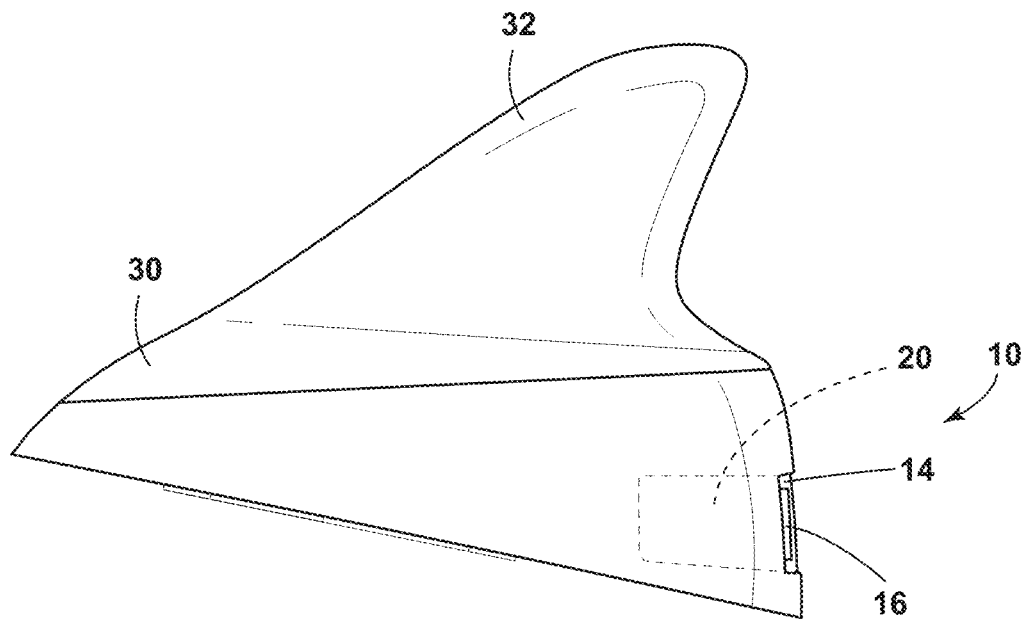
FIG. 9 is a side elevational view of the roof-mounted antenna and imager module of FIG. 6.
Figure 10:
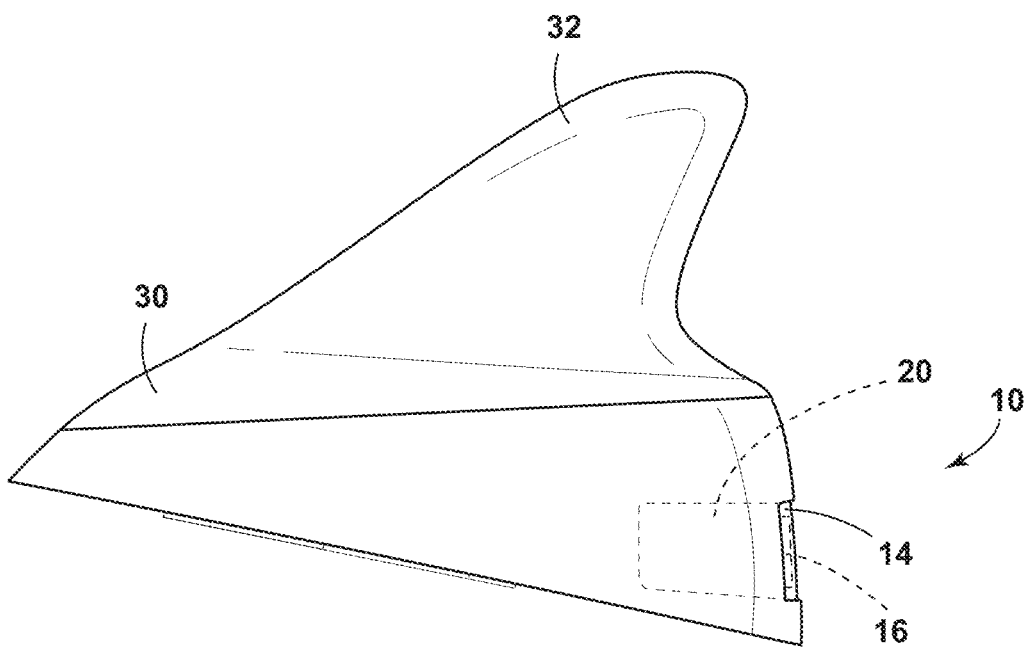
FIG. 10 is a side elevational view of the roof-mounted antenna and imager module of FIG. 9 with the imager module hidden from view.

With reference now to FIGS. 6-10, the cover 14 may include electro-optic functionality which can absorb, reflect, and/or scatter light, thereby obscuring the visibility of the imager 20. The concealing cover 14 may be configured as part of a lens cover or as part of a body panel. In one example, as shown in FIGS. 6 and 7, the cover 14 includes electro-optic device 110 that may be positioned within a housing 30 of a vehicle antenna 32. In this instance, the cover 14 is disposed proximate the imager lens 16 and conceals the imager lens 16 from view outside of the vehicle 12. It is generally contemplated that the cover 14 may include a light absorbing, reflecting, and/or scattering liquid crystal device or electrochromic material. For example, the cover 14 may incorporate the electro-optic device 110 in the form of an electrochromic device that absorbs light in the visible spectrum. Alternatively, the cover 14 may include a concealing device in the form of a light absorbing device, such as a suspended particle device, that absorbs light when activated (FIG. 8), and does not absorb light (FIG. 7) when deactivated.

In instances where the electro-optic device 110 is a liquid crystal device, the electro-optic medium 126 may be a liquid crystal medium and a liquid crystal cell can thus be formed in or on the cover 14 proximate the imager lens 16. Some examples of dimming liquid crystal devices include reflective cholesteric liquid crystal devices, twisted-nematic (TN) liquid crystal devices, and guest-host liquid crystal devices. A reflective cholesteric liquid crystal cell could be used to reflect light and prevent light from reaching the imager 20. In addition to reducing transmission of ambient light, the reflective properties of a reflective cholesteric liquid crystal device will also provide reflection of ambient light. This reflective property will improve the concealment of the imager 20 by increasing the system contrast. The liquid crystal cell can be used in combination with absorbing or reflecting polarizers. If the liquid crystal device includes two absorbing polarizers with a twisted nematic (TN) liquid crystal cell between the polarizers, the liquid crystal device may be used to block light going into or out of the imager 20 in one state, and will allow polarized light to pass through the cover 14 in the opposite state. As an example, the polarizer may be positioned in the cover 14 proximate a liquid crystal device and would have the same transmission orientation as with the polarizer positioned behind the liquid crystal cell. In this instance, the system would block light entering the cover 14 when the liquid crystal device of the cover 14 was nonpowered. When the polarizers are positioned such that they will block both polarization orientations when there is no power, the imager 20 will be hidden behind the cover 14 (FIGS. 8 and 10) when the vehicle 12 ignition is off and would not need to be powered to achieve concealment. The polarizers could be absorbing polarizers or reflective polarizers. If one or more reflective polarizers are used, the concealment device of the cover 14 would be somewhat reflective in the off state, and would help to hide the imager 20. In one example, the concealment device of the cover 14 may be a TN liquid crystal cell with at least one reflective polarizer with the concealment device tipped so that when observed, the concealment device appears to reflect a color that is consistent with the vehicle paint or a color of the surrounding surface on the vehicle 12. If the device is on a roof of the vehicle 12, a top of the concealment device of the cover 14 could be tipped down so a typical observer would be likely to perceive the concealment device of the cover 14 to have the same color tone as the color tone of the paint of the vehicle 12 roof (FIG. 6).

In another construction, it may be advantageous for the electro-optic device 110 to be an electrochromic device or suspended particle device in the cover 14 proximate the imager lens 16 to provide light attenuation. The electrochromic device or suspended particle device may form part of the cover 14. For example, in bright sunlight, the imager 20 may reach a point of light saturation. A dimming device, such as an electrochromic device, could be used to reduce the overall light that reaches the imager 20. It is generally contemplated that the electrochromic device or suspended particle device may be able to be controlled over a wide range of transmission.

There are also a number of light scattering liquid crystal systems that may be used as the electro-optic device 110 to obstruct the view of the imager 20. One such light scattering device may be based on a polymer dispersed liquid crystal (PDLC). It is also generally contemplated that a light scattering device such as a PDLC device and electrochromic device may be used in conjunction as the electro-optic device 110. The electrochromic device could be laminated to the liquid crystal device. Alternatively, the electrochromic device and the liquid crystal device could share a common substrate.

In any of the above examples, the use of an electrochromic device with memory or an electrochromic device with low power consumption will be particularly advantageous for imager concealment systems designed to conceal the imager 20 when the vehicle is parked. In one example, an electrochromic device may be utilized having a low end transmission of 10 percent and measuring at less than 12 percent after four hours, unpowered at open circuit. The same electrochromic device may have a high-end transmission greater than 50 percent. Electrochromic devices that use low power can be designed by changing the chemistry and/or increasing the cell spacing.

Additional details of imager module 10 are disclosed in commonly-assigned U.S. Provisional Application No. 62/685,426 filed on Jun. 15, 2018, entitled "SWITCHABLE LENS COVER," and U.S. patent application Ser. No. 16/407,818 filed on May 9, 2019, entitled "SWITCHABLE IMAGER LENS COVER," the entire disclosures of which are incorporated herein by reference.

Although the use of the electro-optic device 110 in an imager module is described above, the electro-optic device 110 may also be configured for use as an electrochromic mirror.

It will be understood by one having ordinary skill in the art that construction of the described device and other components is not limited to any specific material. Other exemplary embodiments of the device disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiment is illustrative only. Although only one embodiment of the present innovation has been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements may be varied, the nature or number of adjustment positions provided between the elements may be varied. It should be noted that the elements and/or assemblies of the system may be constructed from any of a wide variety of materials that provide sufficient strength or durability. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the claims as interpreted according to the principles of patent law, including the doctrine of equivalents.

What is claimed is:

1. An electro-optic device comprising:
a first transparent substrate having a first surface and a second surface opposite the first surface;
a first transparent electrode provided on the second surface of the first transparent substrate;
a second transparent substrate having a first surface and a second surface opposite the first surface;
a second transparent electrode provided on the first surface of the second transparent substrate, wherein the second transparent substrate is positioned in spaced relation to the first transparent substrate, wherein an extended portion of the first transparent substrate extends beyond an edge of the second transparent substrate;
an electro-optic medium disposed between the first transparent substrate and the second transparent substrate, wherein the electro-optic medium is electrically coupled to the first transparent electrode and the second transparent electrode; and
a printed circuit board mounted directly to the extended portion of the first transparent substrate, the printed circuit board having a first electrical contact electrically coupled to the first transparent electrode.

2. The electro-optic device of claim 1 and further comprising a third transparent electrode provided on the second surface of the first transparent substrate and electrically isolated from the first transparent electrode, wherein the third transparent electrode is electrically coupled to the second transparent electrode, wherein the printed circuit board includes a second electrical contact coupled to the third transparent electrode.

3. The electro-optic device of claim 1, wherein the electro-optic medium is at least one of an electrochromic medium and a liquid crystal medium.

4. The electro-optic device of claim 1, wherein the printed circuit board is mounted to the second surface of the first transparent substrate.

5. The electro-optic device of claim 1 and further including a seal member having an electrically conductive portion and a nonconductive portion, wherein the electrically conductive portion extends between the third transparent electrode and the second transparent electrode such that the third transparent electrode is electrically coupled to the second transparent electrode.

6. The electro-optic device of claim 1, wherein the printed circuit board comprises circuitry for controlling the state of the electro-optic device.

7. An imager module for a vehicle comprising:
a housing having an opening;
an imager disposed in the housing to capture images through the opening; and
the electro-optic device of claim 1 disposed within the opening so as to selectively conceal the imager.

8. An electro-optic device comprising:
a first transparent substrate having a first surface and a second surface opposite the first surface;
a first transparent electrode provided on the second surface of the first transparent substrate;
a second transparent substrate having a first surface and a second surface opposite the first surface;
a second transparent electrode provided on the first surface of the second transparent substrate, wherein the second transparent substrate is positioned in spaced relation to the first transparent substrate, wherein an extended portion of the first transparent substrate extends beyond an edge of the second transparent substrate;
an electro-optic medium disposed between the first transparent substrate and the second transparent substrate, wherein the electro-optic medium is electrically coupled to the first transparent electrode and the second transparent electrode;
a third transparent electrode provided on the second surface of the first transparent substrate and electrically isolated from the first transparent electrode, wherein the third transparent electrode is electrically coupled to the second transparent electrode; and
a printed circuit board mounted directly to the extended portion of the first transparent substrate, the printed circuit board comprising:
a first electrical contact electrically coupled to the first transparent electrode, and
a second electrical contact coupled to the third transparent electrode.

9. The electro-optic device of claim 8, wherein the electro-optic medium is an electrochromic medium.

10. The electro-optic device of claim 8, wherein the printed circuit board is mounted to second surface of first substrate.

11. The electro-optic device of claim 8 and further including a seal member having an electrically conductive portion and a nonconductive portion, wherein the electrically conductive portion extends between the third transparent electrode and the second transparent electrode such that the third transparent electrode is electrically coupled to the second transparent electrode.

12. The electro-optic device of claim 8, wherein the printed circuit board comprises circuitry for controlling the state of the electro-optic device.

13. An imager module for a vehicle comprising:
a housing having an opening;
an imager disposed in the housing to capture images through the opening; and
the electro-optic device of claim 8 disposed within the opening so as to selectively conceal the imager.

14. An imager module for a vehicle comprising:
a housing having an opening;
an imager disposed in the housing to capture images through the opening; and
an electro-optic device disposed within the opening so as to selectively conceal the imager, the electro-optic device comprising:
a first transparent substrate having a first surface and a second surface opposite the first surface;
a first transparent electrode provided on the second surface of the first transparent substrate;
a second transparent substrate having a first surface and a second surface opposite the first surface;
a second transparent electrode provided on the first surface of the second transparent substrate, wherein the second transparent substrate is positioned in spaced relation to the first transparent substrate, wherein an extended portion of the first transparent substrate extends beyond an edge of the second transparent substrate;
an electro-optic medium disposed between the first transparent substrate and the second transparent substrate, wherein the electro-optic medium is electrically coupled to the first transparent electrode and the second transparent electrode; and
a printed circuit board mounted directly to the extended portion of the first transparent substrate, the printed circuit board having a first electrical contact electrically coupled to the first transparent electrode.

15. The imager module of claim 14 and further comprising a third transparent electrode provided on the second surface of the first transparent substrate and electrically isolated from the first transparent electrode, wherein the third transparent electrode is electrically coupled to the second transparent electrode, wherein the printed circuit board includes a second electrical contact coupled to the third transparent electrode.

16. The imager module of claim 14, wherein the electro-optic medium is an electrochromic medium.

17. The imager module of claim 14, wherein the printed circuit board is mounted to the second surface of the first transparent substrate.

18. The imager module of claim 14 and further including a seal member having an electrically conductive portion and a nonconductive portion, wherein the electrically conductive portion extends between the third transparent electrode and the second transparent electrode such that the third transparent electrode is electrically coupled to the second transparent electrode.

19. The imager module of claim 14, wherein the printed circuit board comprises circuitry for controlling the state of the electro-optic device.

20. The imager module of claim 14, wherein the electro-optic medium is a liquid crystal medium and the electro-optic device further includes a polarizer oriented such that the electro-optic device absorbs light when unpowered and transmits light when powered.

\* \* \* \* \*